United States Patent [19]

Nishioka et al.

[11] Patent Number: 4,626,484
[45] Date of Patent: Dec. 2, 1986

[54] LIGHT-SENSITIVE PRINTING PLATE PRECURSOR

[75] Inventors: Akira Nishioka; Takao Nakayama; Tomoaki Takekoshi, all of Shizuoka, Japan

[73] Assignee: Fuji Photo Film Co., Ltd., Kanagawa, Japan

[21] Appl. No.: 290,451

[22] Filed: Aug. 6, 1981

[30] Foreign Application Priority Data

Aug. 11, 1980 [JP] Japan .................. 55-109984

[51] Int. Cl.[4] .............................. G03C 1/68
[52] U.S. Cl. ...................... 430/273; 427/189; 427/421; 430/291; 430/300; 430/327; 430/935
[58] Field of Search .............. 430/273, 935, 300, 327, 430/291; 427/421, 189

[56] References Cited

U.S. PATENT DOCUMENTS

| | | | |
|---|---|---|---|
| 2,916,376 | 12/1959 | Ritter et al. | 430/273 |
| 3,904,795 | 9/1975 | Mercurio | 427/421 |
| 4,009,136 | 2/1977 | Lewandowski et al. | 524/145 |
| 4,072,527 | 2/1978 | Fan | 430/273 |
| 4,168,979 | 9/1979 | Okishi et al. | 430/273 |
| 4,216,289 | 8/1980 | Oda et al. | 430/306 |
| 4,292,389 | 9/1981 | Kojima et al. | 430/935 |

FOREIGN PATENT DOCUMENTS

| | | |
|---|---|---|
| 51-98505 | 8/1976 | Japan . |
| 2025646A | 7/1978 | United Kingdom . |

*Primary Examiner*—Jack P. Brammer
*Attorney, Agent, or Firm*—Sughrue, Mion, Zinn, Macpeak, and Seas

[57] ABSTRACT

A light-sensitive printing plate precursor is described comprising a support having provided thereon a light-sensitive layer, said light-sensitive layer having spray-coated and dried thereon an aqueous liquid containing a resin in a dissolved or dispersed state.

11 Claims, No Drawings

LIGHT-SENSITIVE PRINTING PLATE PRECURSOR

FIELD OF THE INVENTION

This invention relates to a light-sensitive printing plate precursor and, more particularly, to a light-sensitive printing plate precursor prepared by spraying an aqueous solution or aqueous dispersion of a resin onto the surface of a light-sensitive layer and drying it.

BACKGROUND OF THE INVENTION

Exposure of a light-sensitive printing plate precursor through an original has conventionally been conducted by disposing a light-sensitive printing plate precursor and an original in a superposed state between a rubber sheet and a pressure glass, and evacuating the interface between the rubber sheet and the pressure glass to completely contact the original with the surface of the light-sensitive layer of the light-sensitive printing plate precursor.

In order to shorten the vacuum-contacting time, there is known a light-sensitive printing plate precursor having micro-patterns consisting of coated portions and non-coated portions on the light-sensitive layer prepared according to the process described in, for example, U.S. Pat. No. 4,216,289.

Recent requirements for saving resources have promoted the spread of double-coated light-sensitive printing plate precursors. However, in the case of providing micro-patterns on both light-sensitive layer surfaces of such type light-sensitive printing plate precursor according to the above-described process, the micro-patterns must be first coated on one side of the plate precursor and dried, then on the other side of the plate precursor, and thus considerably large-scale equipment is required. In addition, the coated portions of the micro-patterns provided on the back side according to the above-described process are often delaminated or crushed before the step of being cut into a desired size due to rubbing by conveyor rollers, resulting in a longer vacuum-contacting time upon imagewise exposure of the light-sensitive layer on the back side as compared with the exposure on the surface. Also, in the exposure step, the coated portions of the micro-patters on the back side to be exposed layer are sometimes pressed and crushed by a printer upon vacuum exposure of the surface, resulting in a prolonged evacuation upon exposure of the back side.

Japanese Patent Application (OPI) No. 98505/76 (the term "OPI" as used herein refers to a "published unexamined Japanese Patent Application") discloses a process for coating a dispersion of waxy or fine-powdered resin having release properties in a low-boiling organic solvent by air-spraying to thereby solve the problem that the coating for improving the vacuum contact properties stains a film original. However, this spary-coated layer is liable to be delaminated due to weak adhesion force for the surface of the light-sensitive printing plate precursor, thus also causing the above-described problem. In addition, the use of an organic solvent is not favorable from the viewpoint of safety during production of the printing plate precursor.

British Pat. No. GB2,025,646A discloses a process of powdering solid powder and thermally fixing it on a light-sensitive printing plate precursor. With double-coated light-sensitive printing plates precursors, however, the mat layer on one side is likely to be crushed during roller conveying before being cooled after the thermowelding. Conveying without using rollers involves handling difficulties. Further, preparation of powder requires pulverization and classification of a resin, leading to high production costs.

SUMMARY OF THE INVENTION

Therefore, an object of the present invention is to provide a light-sensitive printing plate precursor resistant to rubbing or pressure, and shortening the vacuum-contacting time upon exposure.

Another object of the present invention is to provide a light-sensitive printing plate precursor showing shortened vacuum-contacting time, which can be prepared according to a safe process using simple equipment.

As a result of investigations, the inventors have discovered that a light-sensitive printing plate precursor enabling the attainment of the above-described objects can be obtained by spray-coating an aqueous liquid containing a dissolved or dispersed resin therein on the surface of the light-sensitive layer, and drying it.

Thus, the present invention is a light-sensitive printing plate precursor comprising a support having provided thereon a light-sensitive layer, said light-sensitive layer having spray-coated and dried thereon an aqueous liquid containing a resin in a dissolved or dispersed state.

DETAILED DESCRIPTION OF THE INVENTION

Although the reasons are not completely clear, it is believed that when the aqueous liquid is spray-coated and dried according to the invention, spray-atomized liquid droplets deposit on the surface of the light-sensitive layer, and the drying rate is so fast that, even when the deposited resin is brought into contact with conveyor rollers within a comparatively short time, the resin is not crushed or delaminated. This is believed to be due to a sufficient degree of drying and fixation occurring, and due to strong adhesion to the surface of the light-sensitive layer. In addition, the sprayed and dried resin has a strong resistance to rubbing by rollers and to pressure applied thereto upon vacuum-contacting for imagewise exposure, seemingly because the resin is present as smaller size particles as compared with the coated portions formed by the process described in Japanese Patent Application (OPI) No. 96604/76. Further, the use of the aqueous liquid removes the possibility of explosion encountered in spraying an organic solvent and eliminates the necessity of providing explosion-proof equipment.

As a result of investigations as to the resin to be dissolved or dispersed in the above-mentioned aqueous liquied, the inventors have discovered that copolymers containing the following polymeric units (a), (b), and (c) are particularly excellent:

(a) polymeric units derived from at least one member of the group of monomers consisting of alkyl acrylates having from 2 to 10 carbon atoms in the alkyl moiety and alkyl methacrylates having from 4 to 10 carbon atoms in the alkyl moiety;

(b) polymeric units derived from at least one member of the group of monomers consisting of styrenes, acrylonitriles, methyl methacrylate, and ethyl methacrylate; and (c) polymeric units derived from at least one member of the group of monomers consisting of acrylic acid, methacrylic acid, maleic acid, itaconic acid, alkali metal salts thereof, and ammonium salts thereof.

Polymeric unit (a) is a component imparting an adhesiveness for the surface of the light-sensitive layer. Specific examples of monomers useful therefor include ethyl acrylate, n-propyl acrylate, isopropyl acrylate, n-butyl acrylate, isobutyl acrylate, n-amyl acrylate, isoamyl acrylate, n-hexyl acrylate, 2-ethylhexyl acrylate, n-octyl acrylate, n-decyl acrylate, n-butyl methacrylate, isobutyl methacrylate, n-amyl methacrylate, 2-ethylhexyl methacrylate, n-octyl methacrylate, and n-decyl methacrylate.

Polymeric unit (b) is a component imparting resistance against pressure. Specific examples of monomers useful therefor include styrene, o-methylstyrene, m-methylstyrene, p-methylstyrene, 2,4-dimethylstyrene, 2,5-dimethylstyrene, 3,4-dimethylstyrene, 3,5-dimethylstyrene, 2,4,5-trimethylstyrene, 2,4,6-trimethylstyrene, o-ethylstyrene, m-ethylstyrene, p-ethylstyrene, 3,5-diethylstyrene, 2,4,5-triethylstyrene, p-n-butylstyrene, m-sec-butylstyrene, m-tert-butylstyrene, p-hexylstyrene, p-n-heptylstyrene, p-2-ethylhexylstyrene, o-fluorostyrene, m-fluorostyrene, p-fluorostyrene, o-chlorostyrene, m-chlorostyrene, p-chlorostyrene, 2,3-dichlorostyrene, 2,4-dichlorostyrene, 2,5-dichlorostyrene, 2,6-dichlorostyrene, 3,4-dichlorostyrene, 3,5-dichlorostyrene, 2,3,4,5,6-pentachlorostyrene, m-trifluoromethylstyrene, o-cyanostyrene, m-cyanostyrene, m-nitrostyrene, p-nitrostyrene, p-dimethylaminostyrene, acrylonitrile, α-chloroacrylonitrile, α-bromoacrylonitrile, α-trifluoromethylacrylonitrile, α-trifluoromethylcarboxyacrylonitrile, methyl methacrylate, and ethyl methacrylate.

Polymeric unit (c) is a component improving solubility in a developing solution. Specific examples thereof include acrylic acid, sodium acrylate, potassium acrylate, ammonium acrylate, methacrylic acid, sodium methacrylate, potassium methacrylate, ammonium methacrylate, maleic acid, sodium maleate, potassium maleate, ammonium maleate, itaconic acid, sodium itaconate, potassium itaconate, and ammonium itaconate.

In such copolymers, the contents of polymeric units (a), (b), and (c) are preferably from 10 to 70 wt.%, from 20 to 80 wt.%, and from 6 to 50 wt.%, respectively. As the content of polymeric unit (a) decreases to less than 10%, there results a reduced adhesion force of the copolymer to the surface of the light-sensitive layer. On the other hand, as the content increases to more than 70 wt.%, there results a more decreased pressure resistance of the copolymer. As the content of polymeric unit (b) decreases to less than 20 wt.%, there results a decreased hardness and a decreased pressure resistance of the copolymer. On the other hand, as the content increases to more than 80 wt.%, there results a decreased solubility of the copolymer in a developer and a reduced adhesion force to the light-sensitive layer. Further, as the content of polymeric unit (c) decreases to less than 6 wt.%, there results a poorer solubility of the copolymer in a developer, whereas the content increases to more than 50 wt.%, there results a more fragile copolymer and a reduced adhesion force to the surface of the light-sensitive layer. Thus, particularly preferable contents of the polymeric units (a), (b), and (c) are from 15 to 50 wt.%, from 40 to 70 wt.%, and from 10 to 30 wt.%, respectively.

In case of using the polymer unit (c) wherein 50 to 100 mol.%, preferably 80 to 100 mol.%, of the acid residue are ammonium salt, the copolymer spray-coated shows particularly excellent adhesiveness and such is preferred.

The above-described copolymer may be obtained in the same manner as in synthesizing ordinary latex by emulsifying the starting monomers in water with the aid of a surfactant and conducting emulsion polymerization using a polymerization initiator, such as potassium persulfate, to obtain as an aqueous dispersion. Detailed synthesis methods are described in U.S. Pat. Nos. 1,933,052, 2,117,321, 2,118,863, 2,144,233 and 3,057,812. It is also possible to obtain as an aqueous solution of the copolymer using a sodium salt, potassium salt, or ammonium salt of acrylic or methacrylic acid as the polymeric unit (c).

Concentration of the resin in the aqueous solution or dispersion thereof to be sprayed over the surface of the light-sensitive layer preferably ranges from 10 to 30 wt.%, based on the weight of the aqueous solution or dispersion.

The aqueous liquid to be sprayed may contain other fillers which do not adhere themselves to the light-sensitive layer. As such fillers, there are included, for example, silicon dioxide, zinc dioxide, titanium oxide, zirconium oxide, glass particles, alumina, polymer particles (for example, particles of polymethyl methacrylate, polystyrene, phenol resin, etc.). These can be used in combinations of two or more.

For spraying such resin aqueous solution or dispersion over the surface of the light-sensitive layer, there may be employed known methods such as an air-spraying method, an airless spraying method, an electrostatic air-spraying method, an electrostatic airless spraying method, and an electrostatic spray electrostatic coating method.

The term "spray" means a method comprising spraying an aqueous solution or dispersion of a resin (coating solution) by a spraying device to atomize the coating solution and adsorbing and coating the coating solution sprayed onto a light-sensitive printing plate precursor which is an article to be coated.

The air-spraying method comprises using a compressed air as spraying manner. The airless spraying method (liquid pressure spraying method) comprises spraying the coating solution by applying high pressure to the coating solution. The electrostatic spraying method comprises spraying the coating solution by electrostatic force. The electrostatic coating method is advantageous to increase adhesion efficiency of the resin in the coating solution and comprises employing an earthed article to be coated as an anode and a coating solution spraying device as a cathode, forming an electrostatic field between the anode and the cathode by applying high negative voltage, negatively charging the resin particles and adsorbing the resin particles on the article to be coated with good efficiency.

The aqueous solution or dispersion of the resin spray-coated on the surface of the light-sensitive layer is then dried. Drying may be conducted in a conventional manner by, for example, blowing warm air.

The resin particles thus deposited on the surface of the light-sensitive layer have nearly a semisphere shape and are from 1 to 20μ in height, from 20 to 200μ in width (diameter), and are present in a coverage of from 1 to 1000 particles per mm$^2$, and preferably 5 to 500 particles per mm$^2$.

The light-sensitive printing plate precurson on which the resin is to be deposited as described above fundamentally comprises a support having provided thereon a light-sensitive layer. Particularly remarkable effects of the present invention can be obtained with light-sensitive printing plate precursors to be used for preparing lithographic printing plate precursors. As the support for such light-sensitive lithographic printing plate precursors, various plates are known which are described in detail in British Patent Specification No. 2030309A. Light-sensitive layer can be used comprising a diazo resin, an o-quinonediazide compound, a light-sensitive azide compound, a photopolymerizable composition, a light-sensitive resin, and the like. These are also described in detail in British Patent Specification No. 2030309A.

Coverage of the light-sensitive layer is generally from 0.1 to 7 g/m², and preferably from 0.5 to 3 g/m², in terms of dry weight per side of the plate.

The present invention enables the obtainment of a double-coated light-sensitive printing plate having precursor less differences between the surface and the back side, and having excellent vacuum-contact properties, and raises the efficiency of plate-making stpes. Furthermore, in the production steps, coating can be conducted safely using simple equipment.

The present invention will now be described in more detail by reference to examples of preferred embodiments of the present invention, which, however, are not limitative.

EXAMPLE 1

Both sides of a 0.24-mm thick aluminum plate were grained using a nylon brush and a 400-mesh pumice stone suspension in water, and then washed well with water. This plate was dipped for 3 minutes in a 70° C. sodium tertiary phosphate aqueous solution (5%), washed with water, and dried.

A light-sensitive solution was prepared by dissolving 1 part by weight of naphthoquinone-1,2-diazido-5-sulfonic acid ester of polyhydroxyphenyl obtained by condensation polymerization between acetone and pyrogallol, as described in Japanese Patent Publication No. 28403/68 (corresponding to U.S. Pat. No. 3,635,709, Example 1), and 2 parts by weight of a novolak type phenolformaldehyde resin in 20 parts by weight of 2-methoxyethyl acetate and 20 parts by weight of methyl ethyl ketone, and coated in sequence on the both sides of the support and dried to obtain a double-coated light-sensitive lithographic printing plate precursor.

Copolymer aqueous liquids A to D having the following composition and having a solid concentration of 20% were respectively coated on both sides of this light-sensitive lithographic printing plate precursor by electrostatic air-type spraying (amount of liquid fed: 28 cc/min, spraying air pressure: 3 kg/cm², electrostatic voltage: −80 V, distance between coating material and plate: 350 mm, plate transfer speed: 39 m/sec) followed by drying for 5 seconds at 60° C.

|  | A | B | C | D |
|---|---|---|---|---|
| Methyl methacrylate | 68 wt. % | 68 | 80 | 15 |
| Ethyl acrylate | 20 | 28 | 8 | 70 |
| Sodium acrylate | 12 | 4 | 12 | 15 |

In every coating, the amount of coated resin was 0.1 g/m², the number of liquid droplets was 50 to 100 droplets per mm², and the height and width of the resin after drying were from 2 to 6μ, and from 20 to 150μ, respectively. Time required for the vacuum contact was measured first with the surface of 550×650 mm film, then with the back side thereof, using a 1003×800 mm precursor. After imagewise exposure, the samples were processed in a developer, an aqueous 5 wt.% sodium silicate (molar ratio of $SiO_2/Na_2O$: 1.74) solution, and printing was conducted using the resulting lithographic printing plate precursors. Results thus obtained are tabulated in the following table.

|  | A | B | C | D |
|---|---|---|---|---|
| Vacuum-contact time: |  |  |  |  |
| Surface | 13 sec | 13 sec | 15 sec | 20 sec |
| Back side | 13 sec | 13 sec | 20 sec | 35 sec |
| Printing stain | o* | x** | o | o |
| Inking properties | o | o | o | o |

Notes:
o* - good
x** - bad

EXAMPLE 2

In the same manner as in Example 1, except for using as the resin layer to be coated on the light-sensitive lithographic printing plate precursor a copolymer aqueous dispersion having the following composition (mean particle size: 0.05μ):

methyl methacrylate: 27.5 wt.%
butyl methacrylate: 60 wt.%
methacrylic acid: 12.5 wt.% and coating it by electrostatic spraying (amount of liquid bed: 15 cc/min, spraying air pressure: 2 kg/cm², electrostatic voltage: −70 V, distance between coating material and plate: 300 mm, plate transfer speed: 25 m/min), there was prepared a sample, which showed the same good vacuum-contact properties as Sample A in Example 1, and caused no problems as to performance characteristics.

EXAMPLE 3

In the same manner as in Example 1 except for changing the composition of the coating solution of the light-sensitive layer to that described below, there was obtained a light-sensitive lithographic printing plate precursor.

| Light Sensitive Layer Coating Solution | |
|---|---|
| 2-Hydroxyethyl methacrylate copolymer (1) (Note 1) | 0.87 g |
| 2-Methoxy-4-hydroxy-5-benzoylbenzene-sulfonic acid salt of a condensate between p-diazodiphenylamine and paraformaldehyde | 0.1 g |
| C.I. 42595 | 0.03 g |
| Methanol | 6 g |
| 2-Methoxyethanol | 6 g |

(Note 1): described in Example 1 of U.S. Pat. No. 4,123,276

Coating was conducted so that the dry coated amount was 2 g/m² on each side.

An aqueous colloidal dispersion (solids: 20 wt.%) of a copolymer of the following formulation was coated on the above-described light-sensitive plate precursor by electrostatic spraying under the same conditions as in Example 2 and dried at 50° C. for 5 seconds.

Methyl methacrylate: 50 wt.%
Styrene: 10 wt.%
Ethyl acrylate: 31 wt.%
Ammonium methacrylate: 9 wt.%

As is described in U.S. Pat. No. 3,740,367, this aqueous colloidal dispersion was prepared by adding aqueous ammonia to an aqueous dispersion of methyl methacrylate/styrene/ethyl acrylate/methacrylic acid copolymer to convert methacrylic acid to ammonium salt. The coated amount of the resin was 0.08 g/m², the number of liquid droplets 80 to 150 per mm², the width 20 to 150μ, and the height about 2.5 to 6μ.

Differences between the surface and the back side were examined as to vacuum-contact properties and prolongation or shortening of the vacuum-contacting time after rubbing the coating by a cloth pad. Thus, it was found that difference in vacuum-contacting time between the surface and the back side was only about 10% after rubbing, and the plate obtained had good vacuum-contact properties. The resulting plate also showed good development properties, no stains, and good inking properties after exposure and development processing.

While the invention has been described in detail and with reference to specific embodiments thereof, it will be apparent to one skilled in the art that various changes and modifications can be made therein without departing from the spirit and scope thereof.

What is claimed is:

1. A process for producing a light-sensitive printing plate presursor, which comprises spray-coating an aqueous liquid containing a resin in a dissolved or dispersed state on a light-sensitive layer provided on a support and drying the aqueous liquid, thereby depositing the resin strongly adhered to and as particles on the surface of the light-sensitive layer, wherein said resin particles deposited are from 1 to 20μ in height, from 20 to 200∞ in width, and are present in a coverage from 1 to 1,000 particles per mm², and wherein the deposited resiin is a particulate layer of particles of resin.

2. A process as in claim 1, wherein said resin is a copolymer consisting essentially of:
   (a) polymeric units derived from at least one member of the group of monomers consisting of alkyl acrylates having from 2 to 10 carbon atoms in the alkyl moiety and alkyl methacrylates having from 4 to 10 carbon atoms in the alkyl moiety;
   (b) polymeric units derived from at least one members of the group of monomers consisting of styrenes, acrylonitriles, methyl methacrylate, and ethyl methacrylate; and
   (c) polymeric units derived from at least one member of the group of monomers consisting of acrylic acid, methacrylic acid, maleic acid, itaconic acid, alkali metal salts thereof, and ammonium salts thereof.

3. A process as in claim 2, wherein said copolymer comprises from 10 to 70 wt.% of said polymeric units (a), from 20 to 80 wt.% of said polymeric units (b), and from 6 to 50 wt.% of said polymeric units (c).

4. A process as in claim 2, wherein said copolymer comprises from 15 to 50 wt.% of said polymeric units (a), from 40 to 70 wt.% of said polymeric units (b), and from 10 to 30 wt.% of said polymeric units (c).

5. A process as in claim 1, 2, 3 or 4, wherein said resin comprises from 10 to 30 wt.% of said aqueous liquid.

6. A process as in claims 1, 2, 3 or 4, wherein said resin particles are present in a coverage of from 5 to 500 particles per mm².

7. A process as in claims 2, 3, or 4, wherein 50 to 100 mol% of the acid residue of said polymeric units (c) in said copolymer are in the ammonium salt form.

8. A process as in claim 7, wherein 80 to 100 mol% of the acid residue of said polymeric units (c) in said copolymer are in the ammonium salt form.

9. A process for producing a light-sensitive printing plate precursor, which comprises spray-coating an aqueous liquid containing a resin in a dissolved or dispersed state on a light-sensitive layer provided on a support having a hydrophilic surface and drying the aqueous liquid, thereby forming on the surface of the light-sensitive layer protrusions which are comprised of said resin strongly adhered to the surface of said light-sensitive layer and isolated from each other and wherein the deposited resin is a particulate layer of particles of resin.

10. A process as in claim 5, wherein 50 to 100 mol percent of the acid residue of said polymeric units (c) in said copolymer are in the ammonium salt form.

11. A process as in claim 10, wherein 80 to 100 mol percent of the acid residue of said polymeric unit (c) in said copolymer are in the ammonium salt form.

* * * * *